(12) United States Patent
Lee et al.

(10) Patent No.: US 11,923,327 B2
(45) Date of Patent: Mar. 5, 2024

(54) SILICON PHOTONIC INTERPOSER WITH TWO METAL REDISTRIBUTION LAYERS

(71) Applicant: ROCKLEY PHOTONICS LIMITED, Altrincham (GB)

(72) Inventors: Michael Lee, Los Angeles, CA (US); John Paul Drake, St. Ives (GB); Ying Luo, San Diego, CA (US); Vivek Raghunathan, Mountain View, CA (US); Brett Sawyer, Pasadena, CA (US)

(73) Assignee: Rockley Photonics Limited, Altrincham (GB)

( * ) Notice: Subject to any disclaimer, the term of this patent is extended or adjusted under 35 U.S.C. 154(b) by 99 days.

(21) Appl. No.: 17/596,252

(22) PCT Filed: Jun. 5, 2020

(86) PCT No.: PCT/EP2020/065712
§ 371 (c)(1),
(2) Date: Dec. 6, 2021

(87) PCT Pub. No.: WO2020/245416
PCT Pub. Date: Dec. 10, 2020

(65) Prior Publication Data
US 2022/0310540 A1    Sep. 29, 2022

Related U.S. Application Data

(60) Provisional application No. 62/858,894, filed on Jun. 7, 2019.

(51) Int. Cl.
*H01L 23/00* (2006.01)
*H01L 25/16* (2023.01)

(52) U.S. Cl.
CPC .............. *H01L 24/06* (2013.01); *H01L 24/02* (2013.01); *H01L 24/03* (2013.01); *H01L 24/05* (2013.01);
(Continued)

(58) Field of Classification Search
CPC ......... H01L 24/06; H01L 24/02; H01L 24/05; H01L 24/13; H01L 24/16; H01L 24/32;
(Continued)

(56) References Cited

U.S. PATENT DOCUMENTS

| 7,977,783 B1 | 7/2011 | Park et al. |
| 2004/0042190 A1 | 3/2004 | Eng et al. |

(Continued)

FOREIGN PATENT DOCUMENTS

WO    WO 2019/050477 A1    3/2019

OTHER PUBLICATIONS

International Search Report and Written Opinion of the International Searching Authority, dated Sep. 2, 2020, Corresponding to PCT/EP2020/065712, 11 pages.
(Continued)

*Primary Examiner* — Douglas W Owens
(74) *Attorney, Agent, or Firm* — Lewis Roca Rothgerber Christie LLP

(57) ABSTRACT

A silicon integrated circuit. In some embodiments, the silicon integrated circuit includes a first conductive trace, on a top surface of the silicon integrated circuit, a dielectric layer, on the first conductive trace, and a second conductive trace, on the dielectric layer, connected to the first conductive trace through a first via.

17 Claims, 14 Drawing Sheets

(52) U.S. Cl.
CPC ............ *H01L 25/167* (2013.01); *H01L 24/13* (2013.01); *H01L 24/16* (2013.01); *H01L 24/32* (2013.01); *H01L 24/73* (2013.01); *H01L 2224/02313* (2013.01); *H01L 2224/02331* (2013.01); *H01L 2224/0235* (2013.01); *H01L 2224/02375* (2013.01); *H01L 2224/02381* (2013.01); *H01L 2224/0239* (2013.01); *H01L 2224/03462* (2013.01); *H01L 2224/03614* (2013.01); *H01L 2224/03914* (2013.01); *H01L 2224/0401* (2013.01); *H01L 2224/05008* (2013.01); *H01L 2224/05015* (2013.01); *H01L 2224/05018* (2013.01); *H01L 2224/05024* (2013.01); *H01L 2224/05073* (2013.01); *H01L 2224/05082* (2013.01); *H01L 2224/05083* (2013.01); *H01L 2224/05124* (2013.01); *H01L 2224/05144* (2013.01); *H01L 2224/05147* (2013.01); *H01L 2224/05155* (2013.01); *H01L 2224/05166* (2013.01); *H01L 2224/05169* (2013.01); *H01L 2224/05171* (2013.01); *H01L 2224/05172* (2013.01); *H01L 2224/05181* (2013.01); *H01L 2224/05184* (2013.01); *H01L 2224/05548* (2013.01); *H01L 2224/05555* (2013.01); *H01L 2224/05558* (2013.01); *H01L 2224/05611* (2013.01); *H01L 2224/05644* (2013.01); *H01L 2224/06051* (2013.01); *H01L 2224/061* (2013.01); *H01L 2224/06102* (2013.01); *H01L 2224/06505* (2013.01); *H01L 2224/13083* (2013.01); *H01L 2224/13111* (2013.01); *H01L 2224/13139* (2013.01); *H01L 2224/13147* (2013.01); *H01L 2224/13155* (2013.01); *H01L 2224/16227* (2013.01); *H01L 2224/32225* (2013.01); *H01L 2224/73204* (2013.01)

(58) Field of Classification Search
CPC . H01L 2224/05018; H01L 2224/05073; H01L 2224/05082; H01L 2224/05083; H01L 2224/05124; H01L 2224/05144; H01L 2224/05147; H01L 2224/05155; H01L 2224/05166; H01L 2224/05169; H01L 4/05171; H01L 2224/05172; H01L 2224/05181; H01L 2224/05184; H01L 2224/05558; H01L 2224/05611; H01L 2224/05644; H01L 2224/06051; H01L 2224/06505; H01L 2224/13083; H01L 2224/131111; H01L 2224/13139; H01L 2224/13147; H01L 2224/13155; H01L 2224/16227; H01L 2224/32225; H01L 2224/73204

See application file for complete search history.

(56) References Cited

U.S. PATENT DOCUMENTS

| | | | |
|---|---|---|---|
| 2005/0017361 A1* | 1/2005 | Lin | H01L 23/5222 257/E23.144 |
| 2008/0001290 A1* | 1/2008 | Chou | H01L 23/53252 257/E23.079 |
| 2014/0167269 A1 | 6/2014 | Lu et al. | |
| 2014/0203397 A1 | 7/2014 | Yen et al. | |
| 2014/0252548 A1 | 9/2014 | Yen et al. | |
| 2015/0036970 A1 | 2/2015 | Lai et al. | |
| 2015/0162256 A1* | 6/2015 | Hsu | H01L 23/481 257/774 |
| 2016/0155723 A1* | 6/2016 | Lou | H01L 25/105 257/774 |
| 2017/0338204 A1 | 11/2017 | Lee et al. | |
| 2018/0053740 A1* | 2/2018 | Kakade | H05K 1/185 |
| 2020/0075441 A1* | 3/2020 | Kim | H01L 23/3107 |

OTHER PUBLICATIONS

U.K. Intellectual Property Office Search and Examination Report, dated Nov. 18, 2020, for Patent Application No. GB2008514.8, 6 pages.

* cited by examiner

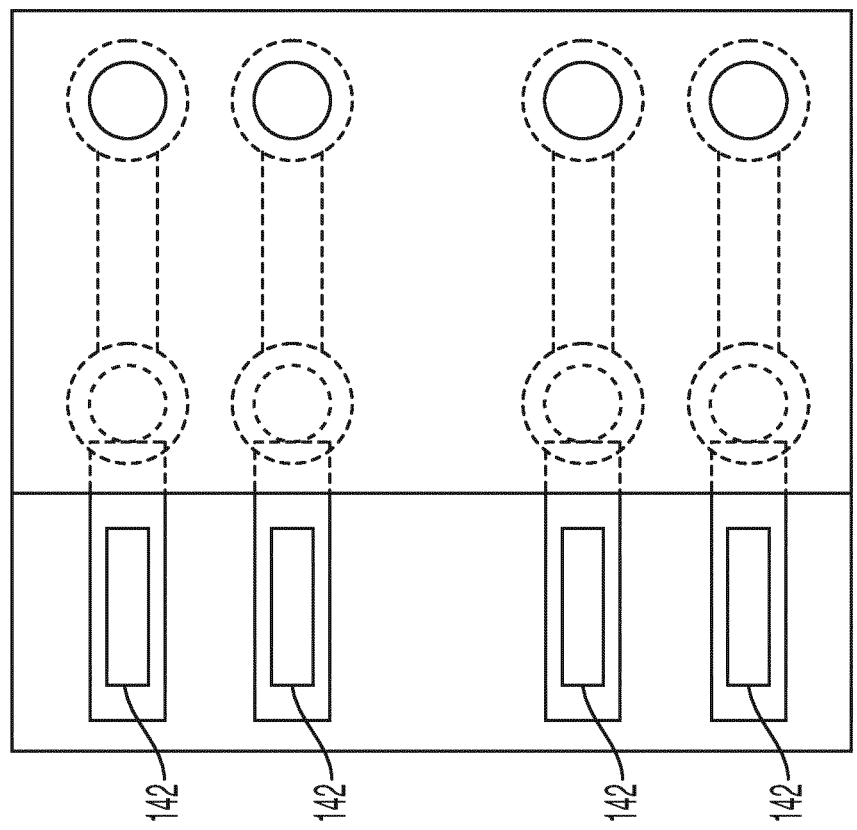
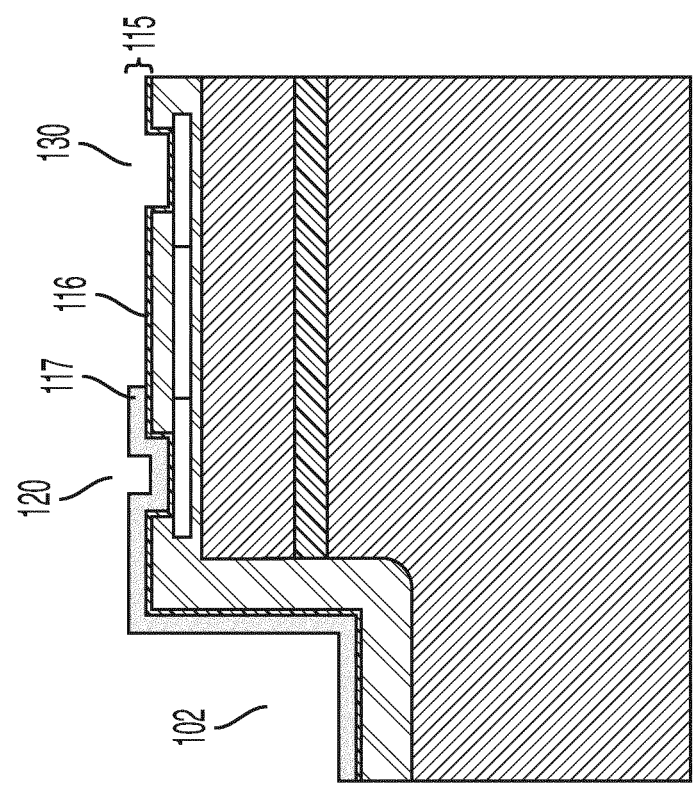
FIG. 5B
FIG. 5A

SILICON PHOTONIC INTERPOSER WITH TWO METAL REDISTRIBUTION LAYERS

CROSS-REFERENCE TO RELATED APPLICATION(S)

This application is a U.S. national stage entry, under 35 U.S.C. § 371, of International Application Number PCT/EP2020/065712, filed on Jun. 5, 2020, which claims priority to and the benefit of U.S. Provisional Patent Application No. 62/858,894, filed Jun. 7, 2019. The entire contents of all of the applications identified in this paragraph are incorporated herein by reference.

FIELD

One or more aspects of embodiments according to the present disclosure relate to silicon photonics packaging, and more particularly to a silicon photonic interposer with two redistribution metal layers.

BACKGROUND

In a package combining a photonic integrated circuit with one or more electronic integrated circuits, it may be advantageous for the photonic integrated circuit to provide some routing of electrical signals, and for the photonic integrated circuit to provide under bump metallization capture pads to capture solder bumps for making electrical connections to an electronic integrated circuit or to a package (e.g., a fanout wafer level package that may contain one or more electronic integrated circuits.

Thus, there is a need for an improved system for forming metal features on the top surface of a photonic integrated circuit.

SUMMARY

According to an embodiment of the present invention, there is provided a silicon integrated circuit, including: a first conductive trace, on a top surface of the silicon integrated circuit; a dielectric layer, on the first conductive trace; and a second conductive trace, on the dielectric layer, connected to the first conductive trace through a first via.

In some embodiments, the silicon integrated circuit further includes an under bump metallization capture pad, on, and connected to the first conductive trace through, a second via.

In some embodiments, the under bump metallization capture pad includes: a layer of nickel, and a layer of gold on the layer of nickel.

In some embodiments, the silicon integrated circuit further includes a wire bond pad, on, and connected to the first conductive trace through, a second via.

In some embodiments, the first conductive trace is composed of a material selected from the group consisting of gold, aluminum, copper, and alloys and combinations thereof.

In some embodiments, the second conductive trace is composed of a material selected from the group consisting of gold, aluminum, copper, titanium, tungsten, tantalum, and alloys and combinations thereof.

In some embodiments, the second conductive trace further includes a layer of titanium tungsten.

In some embodiments, the dielectric layer is composed of a material selected from the group consisting of silicon dioxide, silicon nitride, benzocyclobutene, polyimides, and combinations thereof.

In some embodiments, the dielectric layer is composed of silicon nitride.

According to an embodiment of the present invention, there is provided a method for fabricating a silicon integrated circuit, the method including: fabricating a first intermediate product, including: a silicon substrate, a first conductive layer on the silicon substrate, and a dielectric layer on the first conductive layer; etching a first opening and a second opening, into the dielectric layer, onto the first conductive layer; forming a second conductive layer on the dielectric layer and on the first conductive layer in the first opening and in the second opening; and removing a portion of the second conductive layer in a region including the second opening and a region surrounding the second opening.

In some embodiments, the method further includes forming a wire bond pad on the first conductive layer in the second opening.

In some embodiments, the method further includes: forming an under bump metallization capture pad on: the first conductive layer in the second opening, and a region surrounding the second opening; and removing a remainder of the second conductive layer in a region around the under bump metallization capture pad.

In some embodiments, the under bump metallization capture pad includes: a layer of nickel, and a layer of gold on the layer of nickel.

In some embodiments, the first conductive layer is composed of a material selected from the group consisting of aluminum, copper, gold, and alloys and combinations thereof.

In some embodiments, the second conductive layer includes a layer of a material selected from the group consisting of gold, copper, aluminum, and alloys and combinations thereof.

In some embodiments, the second conductive layer further includes a layer of material selected from the group consisting of titanium, tungsten, tantalum, and alloys and combinations thereof.

In some embodiments, the dielectric layer is composed of a material selected from the group consisting of silicon dioxide, silicon nitride, benzocyclobutene, polyimides, and combinations thereof.

BRIEF DESCRIPTION OF THE DRAWINGS

These and other features and advantages of the present disclosure will be appreciated and understood with reference to the specification, claims, and appended drawings wherein:

FIG. 5A is a side view of an intermediate product, according to an embodiment of the present disclosure;

FIG. 5B is a top view of the intermediate product of FIG. 5A, according to an embodiment of the present disclosure;

DETAILED DESCRIPTION

The detailed description set forth below in connection with the appended drawings is intended as a description of exemplary embodiments of a silicon photonic interposer with two metal redistribution layers provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1A:
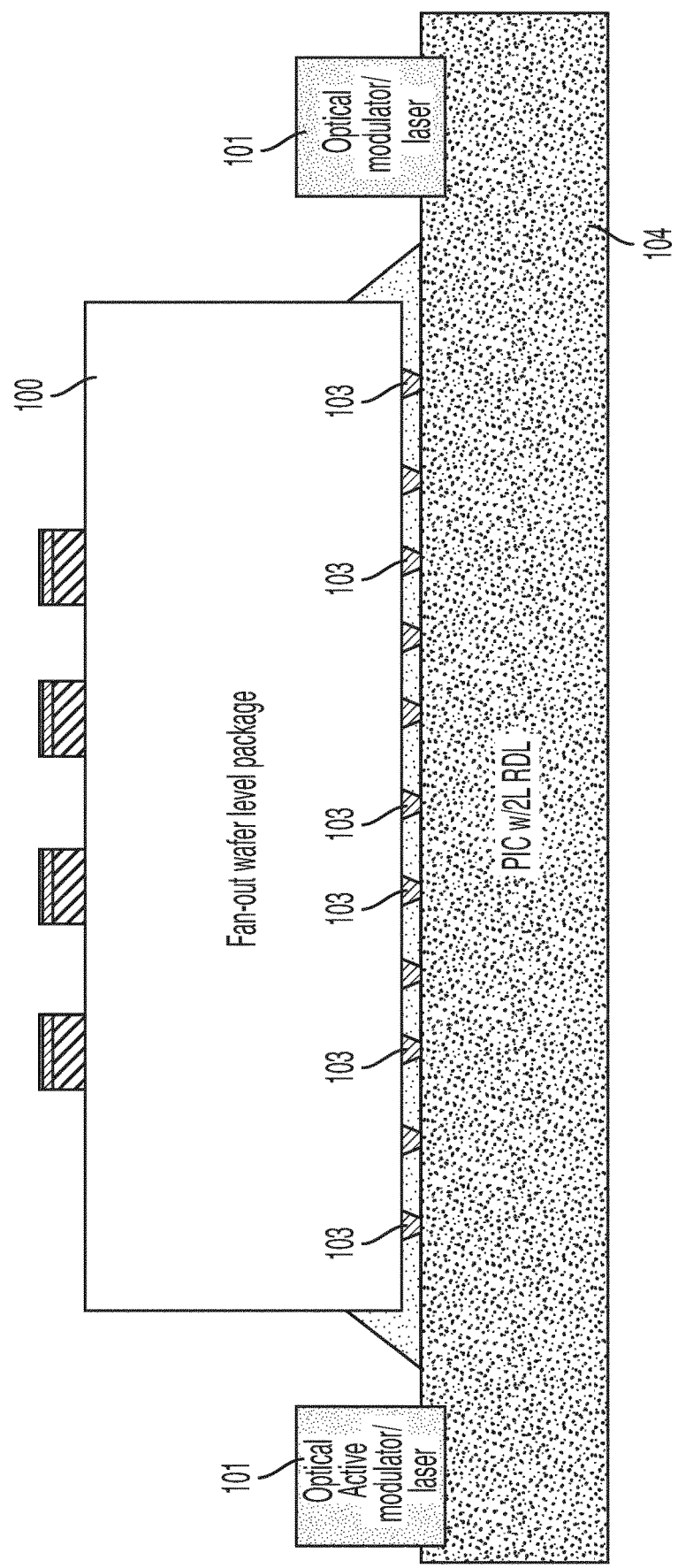
FIG. 1A is a side view of a portion of a package, according to an embodiment of the present disclosure.

FIG. 1A shows an application for some embodiments: forming connections, using conductors on a photonic integrated circuit (PIC) 104, between a fan out wafer level package 100 and an electro-optical device 101 (or an "electro-optical chip") such as a modulator, a laser, or a photodetector. The photonic integrated circuit 104 may be used to support and connect the fan out wafer level package and one or more electro-optical chips, for example by providing under bump metallization capture pads to capture solder bumps 103 on the fan out wafer level package 100. The photonic integrated circuit 104 may also provide an interface between one or more optical fibers and the one or more electro-optical chips. This interface may include V-grooves for aligning the optical fibers to waveguides on the photonic integrated circuit, mode converters for converting the mode shape of an optical fiber to a mode shape suitable for interaction with an electro-optical chip, and waveguides (which may include sections, e.g. tapered sections, that operate as the mode converters), for guiding light between the fibers and the electro-optical chips. The photonic integrated circuit may be fabricated on a silicon substrate (e.g., a silicon on insulator (SOI) substrate), i.e., it may be a silicon integrated circuit. The surface of the photonic integrated circuit on which fine features (e.g., waveguides, and conductive traces (as described herein)) are fabricated may be referred to as the "top surface" of the photonic integrated circuit.

Figure 1B:
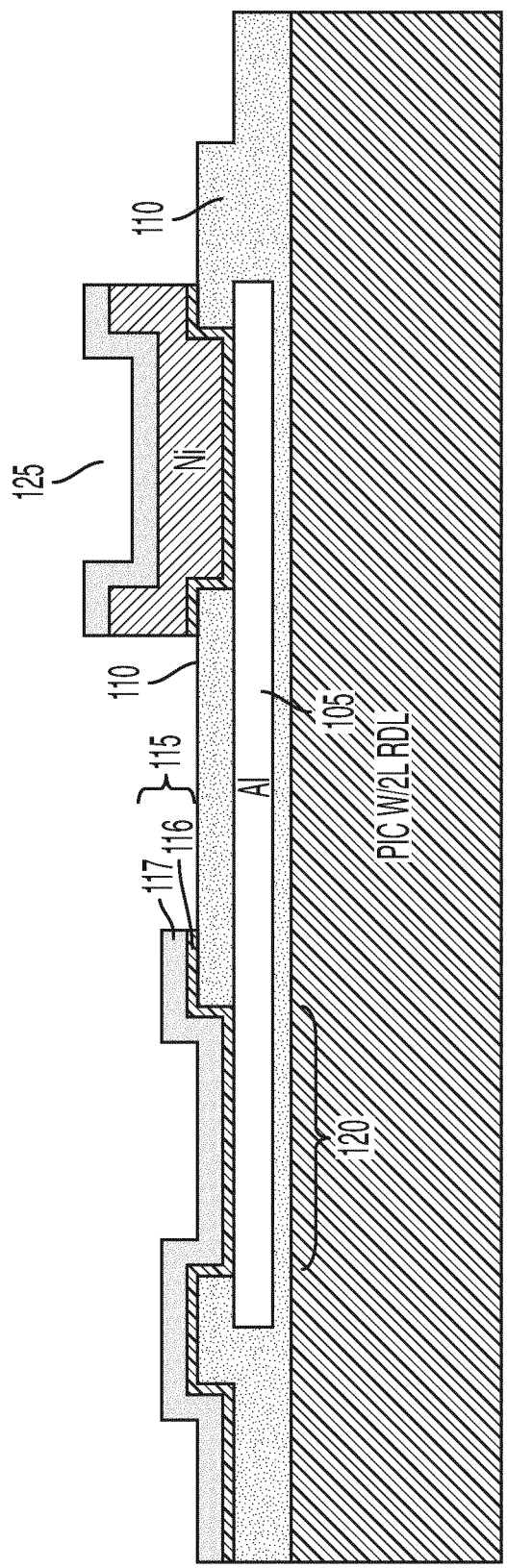
FIG. 1B is a side view of a portion of a photonic integrated circuit, according to an embodiment of the present disclosure.

FIGS. 1A and 1B show a structure according to some embodiments. A first conductive trace 105 (e.g., a conductive trace composed of aluminum, copper, gold, or other suitable metal) may be part of a first metal layer which may be referred to as a first RDL conductive layer (where RDL is an abbreviation for redistribution layer). A dielectric layer 110 may be formed on the first metal layer, i.e., on the first conductive trace 105, and a layer that may be referred to as the UBM1 layer, forming a second conductive trace 115, may be formed on the dielectric layer 110. The UBM1 layer may be an integrated layer including (i) a second RDL conductive layer and (ii) an under bump metallization (UBM) layer. For example, the UBM1 layer may be a composite layer composed of sublayers including a first barrier layer 116 (e.g., a first TiW layer) on the dielectric layer 110, a conductive metal layer (e.g., a first gold layer) on the first barrier layer, a second barrier layer (e.g., a second TiW layer) on the conductive metal layer, and a solder adhesion metal layer (e.g., a second gold layer) on the second barrier layer. For ease of illustration, the four layers of the UBM1 layer 115 are shown as two layers in FIG. 1: the first barrier layer 116, and on the first barrier layer 116, a composite "upper layer" 117, which includes the conductive metal layer, the second barrier layer, and the solder adhesion metal layer. Within the UBM1 layer, the first barrier layer and the conductive metal layer may together form the second RDL conductive layer, and the second barrier layer and the solder adhesion metal layer may together form the UBM layer. In some embodiments, the structure includes a plurality of metal layers like the first metal layer described above, each including one or more conductive traces. These layers may be formed, e.g., by alternating deposition steps of dielectric and metal, and the traces in them may be interconnected at vias.

The UBM1 layer may extend into a cavity 102 (see FIGS. 2A-8B); in the cavity, the UBM layer within the UBM1 layer (e.g., the upper two sublayers of the UBM1 layer) may act as an under bump metallization layer for attaching the electro-optical chip (e.g., with AuSn solder, as discussed in further detail below). As used herein, an "under bump metal" layer, or an "under bump metallization" layer, or a "UBM" layer, is a layer (a "simple" layer composed of a single material, or a "composite" layer composed of a plurality of simple layers, of different materials) that (i) has an upper surface suitable for forming a solder joint (a "solder adhesion" surface) and that (ii) is, or includes, a barrier layer for preventing the solder (or other materials in the UBM layer) from diffusing into the surface on which the UBM layer is formed. The UBM layer (which, as mentioned above, may be a composite layer including a layer of TiW, and a layer of gold) of the UBM1 layer may serve as both a barrier and adhesion layer for the subsequent back end of line processing (e.g., for the soldering of the electro-optical chip to the UBM1 layer). As mentioned above, the TiW layer of the UBM layer of the UBM1 layer may act as a diffusion barrier; it may prevent Au from intermixing with, or diffusing into, the Al pads or the silicon in the PIC. In some embodiments, materials other than TiW may be used in the barrier layer or layers, e.g., Pt, Cr, Ni, NiV, Ti, or W may be used instead of TiW. In some embodiments, the UBM layer or the UBM1 layer may be composed of any other combination of materials known in the art for under bump metallization, e.g., nickel and gold, or nickel, palladium and gold.

The second conductive trace 115 may be connected to the first conductive trace 105 at a first via 120 (formed as an opening in the dielectric layer 110 at which the second conductive trace 115 is able to make contact with the first conductive trace 105). An under bump metallization capture pad 125 (e.g., a pad including a layer of nickel and a layer of gold on the layer of nickel) may also be formed on the dielectric layer 110, and extending through the dielectric layer 110, at a second via 130, to make contact with the first conductive trace 105.

The under bump metallization capture pad 125 may be surrounded by the dielectric layer 110, which may act to passivate the underlying metal layer, and to prevent solder from wetting the area surrounding the capture pad. For example, if the under bump metallization capture pad 125 is used to capture a solder bump on the fan out wafer level package, the dielectric layer 110 may prevent the solder of the solder bump from spreading beyond the under bump metallization capture pad 125 as it might if, instead of being surrounded by the dielectric layer 110 (which is not wettable by solder), the under bump metallization capture pad 125 were surrounded by a material (e.g., gold) that is wettable by solder.

Figure 1C:
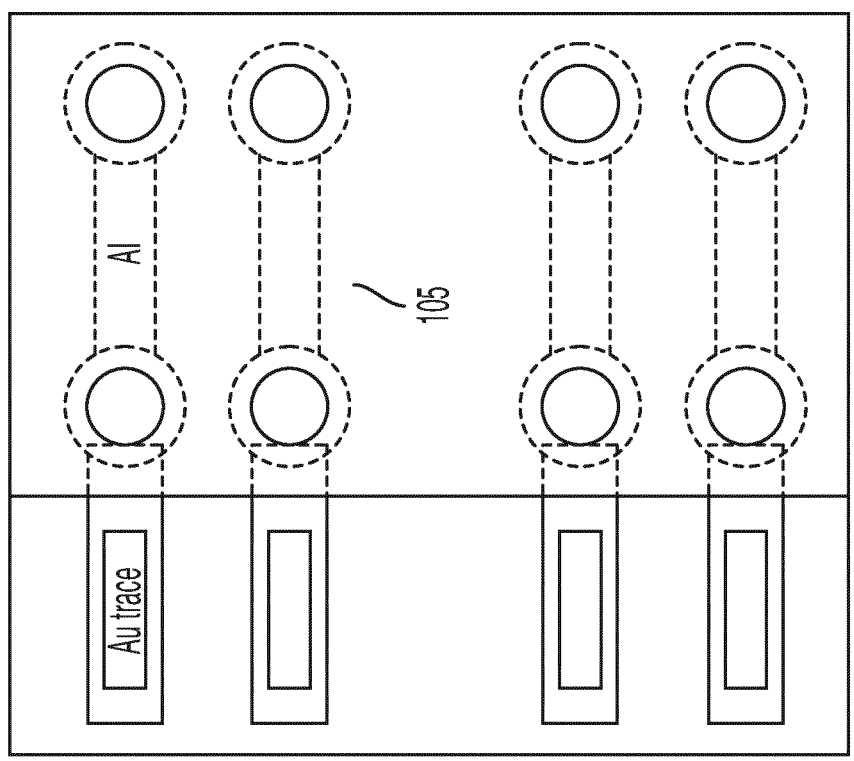
FIG. 1C is a top view of the portion of a package shown in FIG. 1B, according to an embodiment of the present disclosure.
Figure 2B:
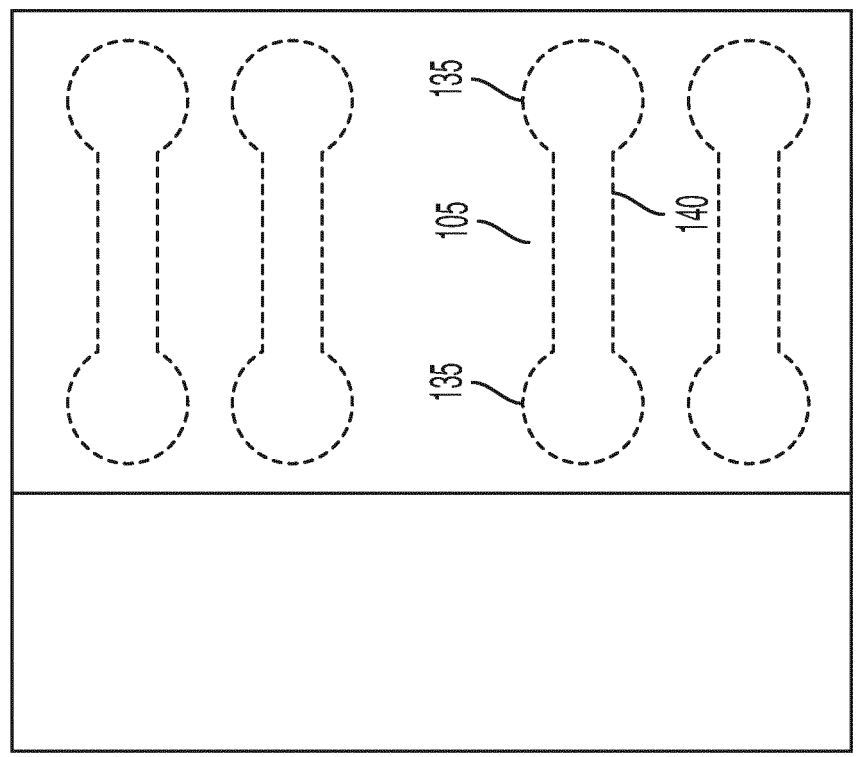
FIG. 2B is a top view of the intermediate product of FIG. 2A, according to an embodiment of the present disclosure.
Figure 2A:
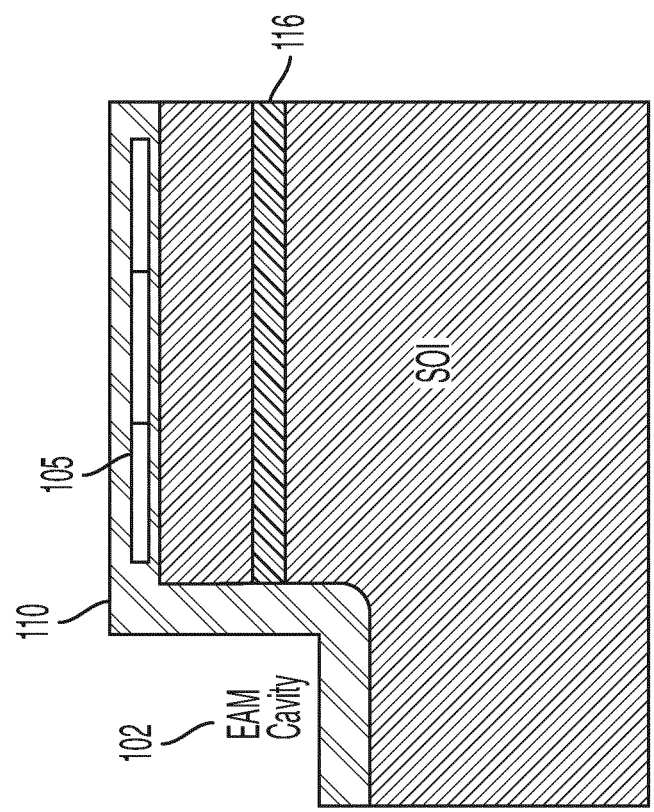
FIG. 2A is a side view of an intermediate product, according to an embodiment of the present disclosure.
Figure 7B:
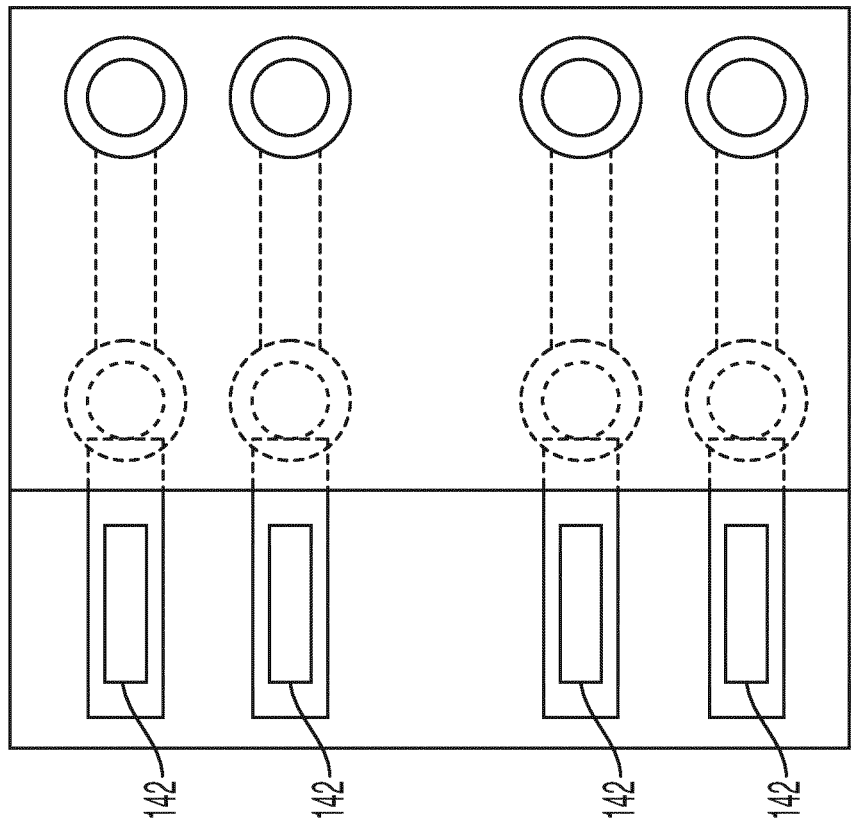
FIG. 7B is a top view of the intermediate product of FIG. 7A, according to an embodiment of the present disclosure.
Figure 7A:
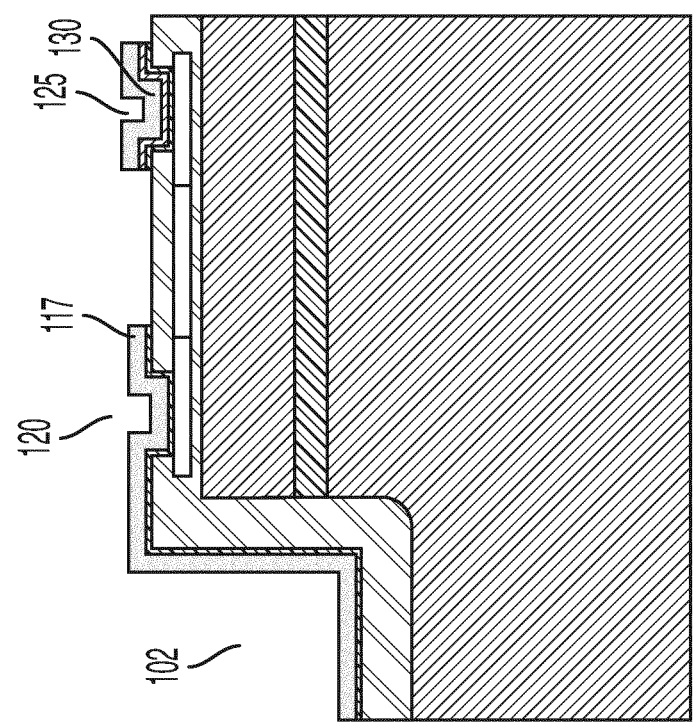
FIG. 7A is a side view of an intermediate product, according to an embodiment of the present disclosure.
Figure 8B:
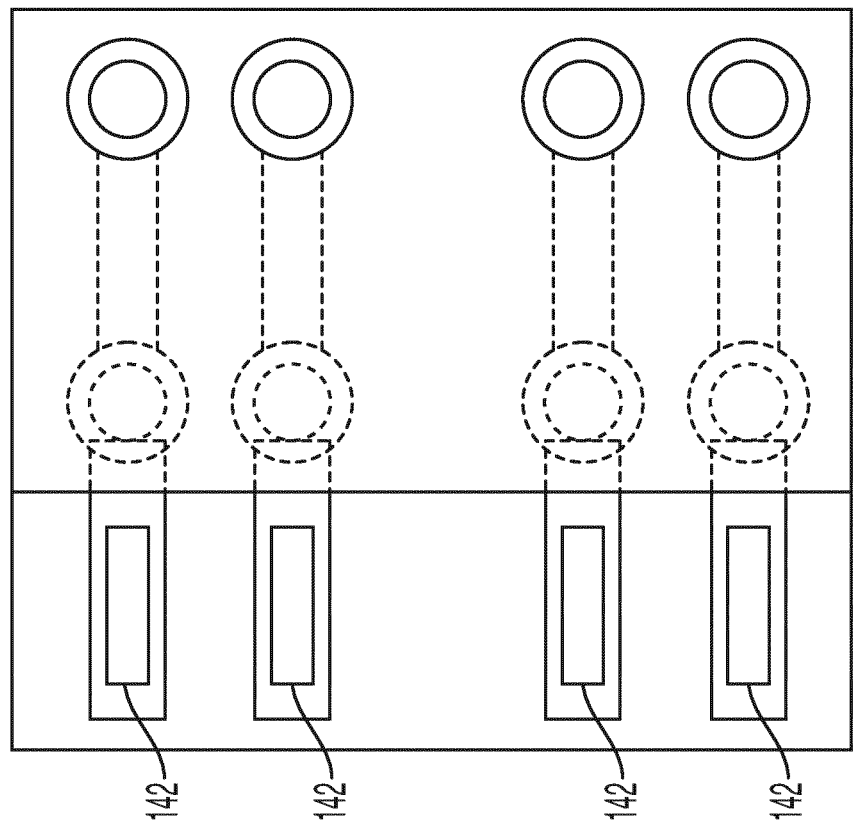
FIG. 8B is a top view of the intermediate product of FIG. 8A, according to an embodiment of the present disclosure.

FIGS. 2A-8B show (intermediate products, and the final product, in) a process for fabricating a structure like that of FIGS. 1B and 1C, in some embodiments. FIGS. 2A and 2B show a structure that may result from a front end of line (FEOL) process, using a SOI wafer. The structure includes the cavity 102 for an electro-optical chip extending below the buried oxide (BOX) layer 116, a dielectric cladding layer 110, and the first metal layer (forming, e.g., conductive traces including the first conductive trace 105), in the dielectric cladding layer. Some or all of the conductive traces of the first metal layer may have the shape of a "dog bone" as shown in FIG. 8B, with two circular portions 135, for forming the first via 120 and the second via 130, connected by a narrower conductive strip 140. The dielectric cladding layer may be composed of any suitable dielectric, e.g., silicon dioxide, silicon nitride, benzocyclobutene (BCB), or a polyimide.

Figure 3B:
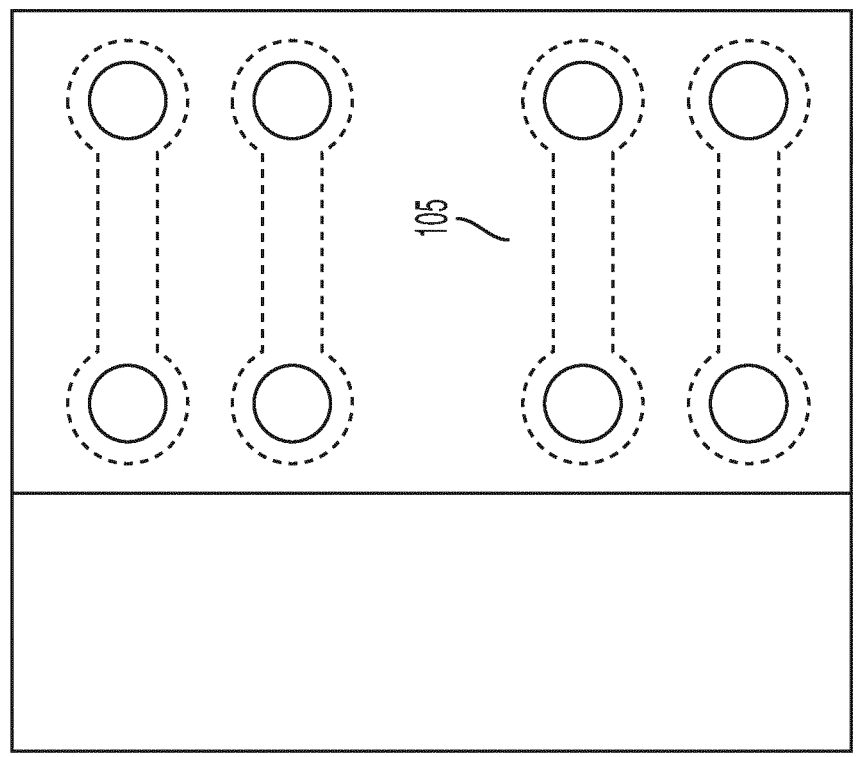
FIG. 3B is a top view of the intermediate product of FIG. 3A, according to an embodiment of the present disclosure.
Figure 3A:
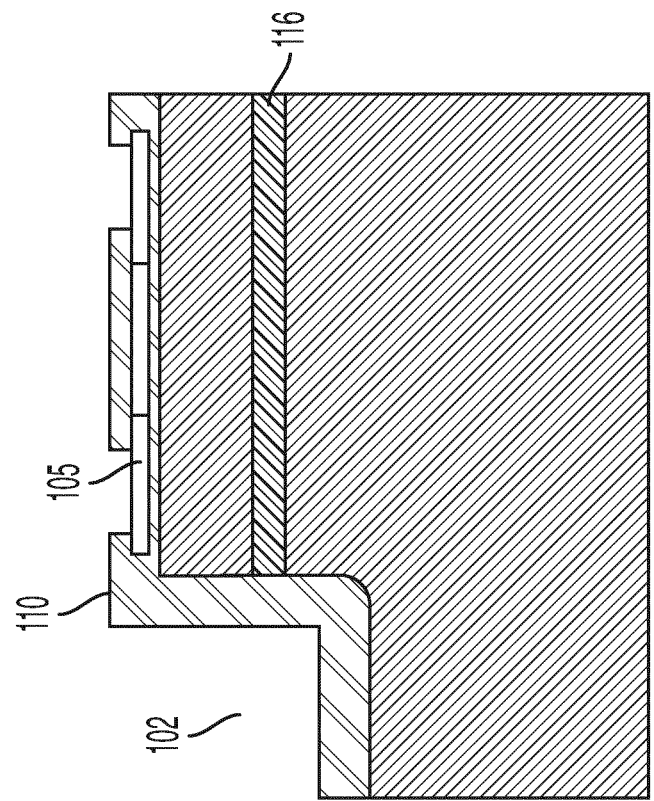
FIG. 3A is a side view of an intermediate product, according to an embodiment of the present disclosure.

FIGS. 3A and 3B show an intermediate structure formed after a pad opening etch to expose the circular portions 135 (or "pads") of the dog bone. The narrower conductive strip 140 may be beneath the dielectric cladding layer, thereby isolating the pads. Fabricating the dog bone structures in the FEOL may significantly simplify the back end of line (BEOL) process flow.

Figure 4B:
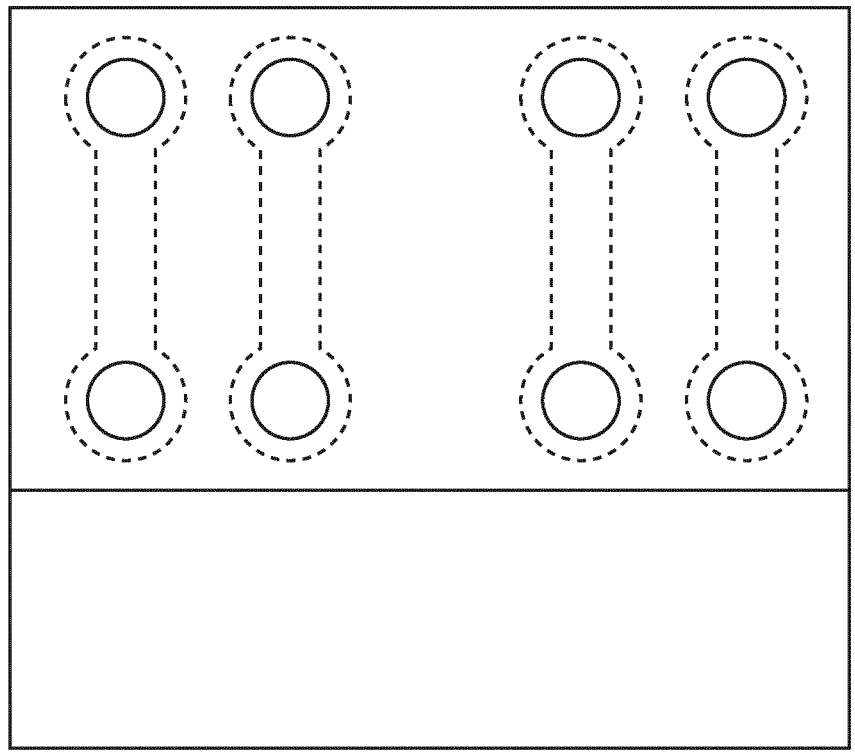
FIG. 4B is a top view of the intermediate product of FIG. 4A, according to an embodiment of the present disclosure.
Figure 4A:
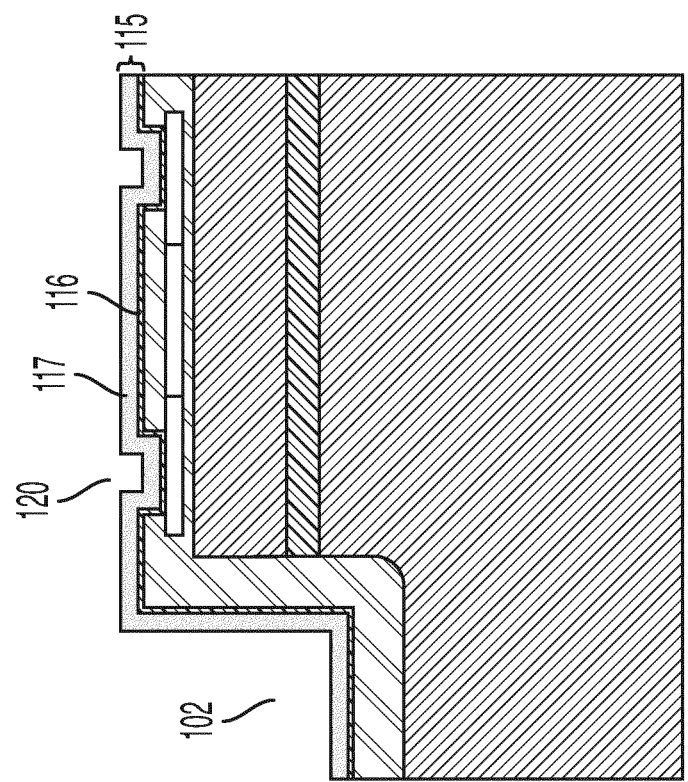
FIG. 4A is a side view of an intermediate product, according to an embodiment of the present disclosure.

FIGS. 4A and 4B show an intermediate structure after the deposition of the UBM1 layer. As mentioned above, the UBM1 metal stack may serve as both a barrier and adhesion layer for the subsequent back end of line processing, and as a second RDL conductive layer. In FIGS. 4A and 4B, UBM1 115 covers both Al pads 135.

FIGS. 5A and 5B show an intermediate structure after removal of portions of the UBM1 layer to define conductive traces for forming connections to the electro-optical chip, and for forming mesas 142. Each mesa 142 may be formed by etching away the two top sublayers of the UBM1 layer in a region surrounding the mesa 142, and each mesa 142 may act to decrease the tendency, in the solder used to attach the electro-optical chip, to flow onto areas of the conductive trace surrounding the mesa. The Au/TiW metal trace 115 forms an electrical contact with the Al dog bone, at the first via 120. In a region including the opening at which the second via 130 is to be formed, an etch, referred to as an "SB_UBM" etch, removes all of the layers of the UBM1 layer except the first barrier layer 116 to expose the first barrier layer (e.g., the first TiW layer), which remains to be used as a seed layer for Ni and Au electroplating of the bonding pad. For ease of illustration, the mesas 142 are not shown in FIG. 5A.

Figure 6B:
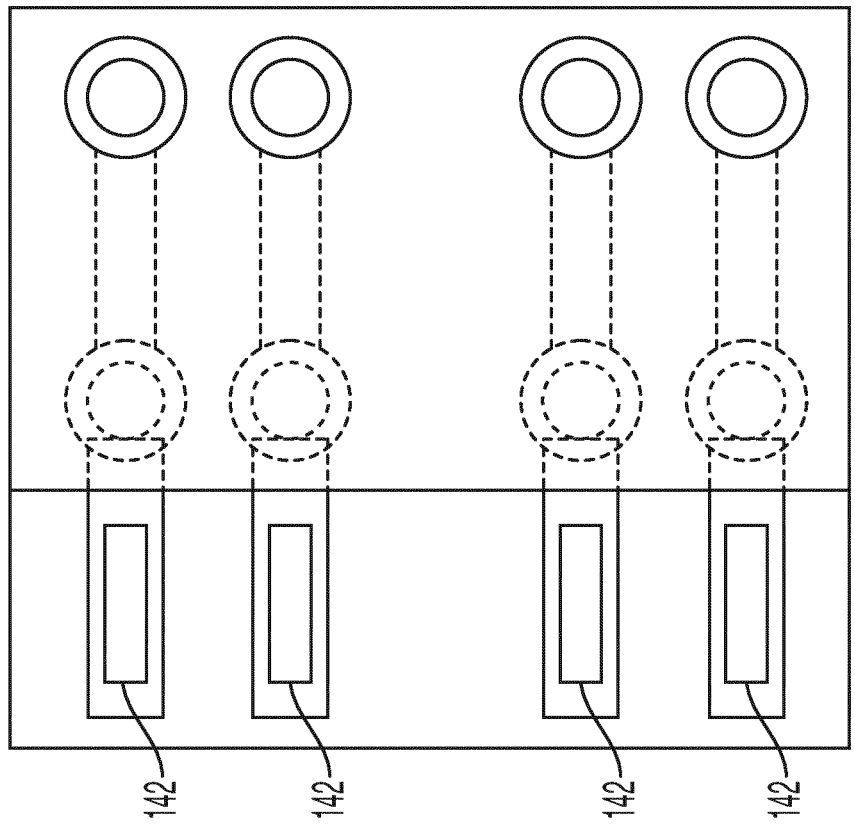
FIG. 6B is a top view of the intermediate product of FIG. 6A, according to an embodiment of the present disclosure.
Figure 6A:
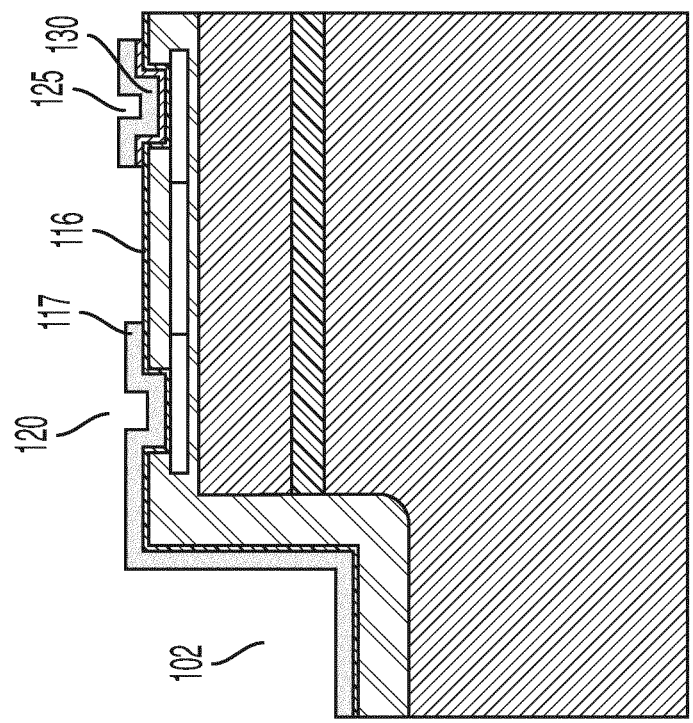
FIG. 6A is a side view of an intermediate product, according to an embodiment of the present disclosure.

FIGS. 6A and 6B show an intermediate structure formed after patterning photoresist to design the Ni/Au bonding pads, electroplating nickel and electroplating Au on the nickel, and stripping the photoresist. The nickel and gold (Au) layers form a second under bump metallization layer (UBM2) which acts as an under bump metallization capture pad 125 (formed on the second via 130) suitable for forming Sn Ag Cu (SAC) solder joints with SAC solder bumps that may be present on a surface of the fan out wafer level package.

Figure 8A:
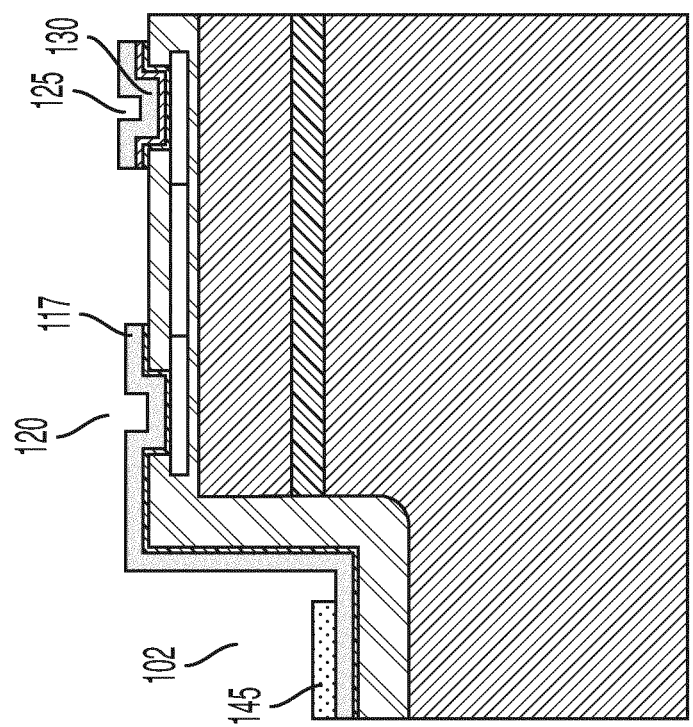
FIG. 8A is a side view of an intermediate product, according to an embodiment of the present disclosure.

FIGS. 7A and 7B show an intermediate structure formed after etching away the TiW seed layer between the pads of the dog bone, isolating the pads of the dog bone. FIGS. 8A and 8B show a structure formed after deposition and patterning of the AuSn solder pads 145. Each such AuSn solder pad 145 may be used to solder a terminal of an electro-optical chip to a respective second conductive trace 115.

Figure 9A:
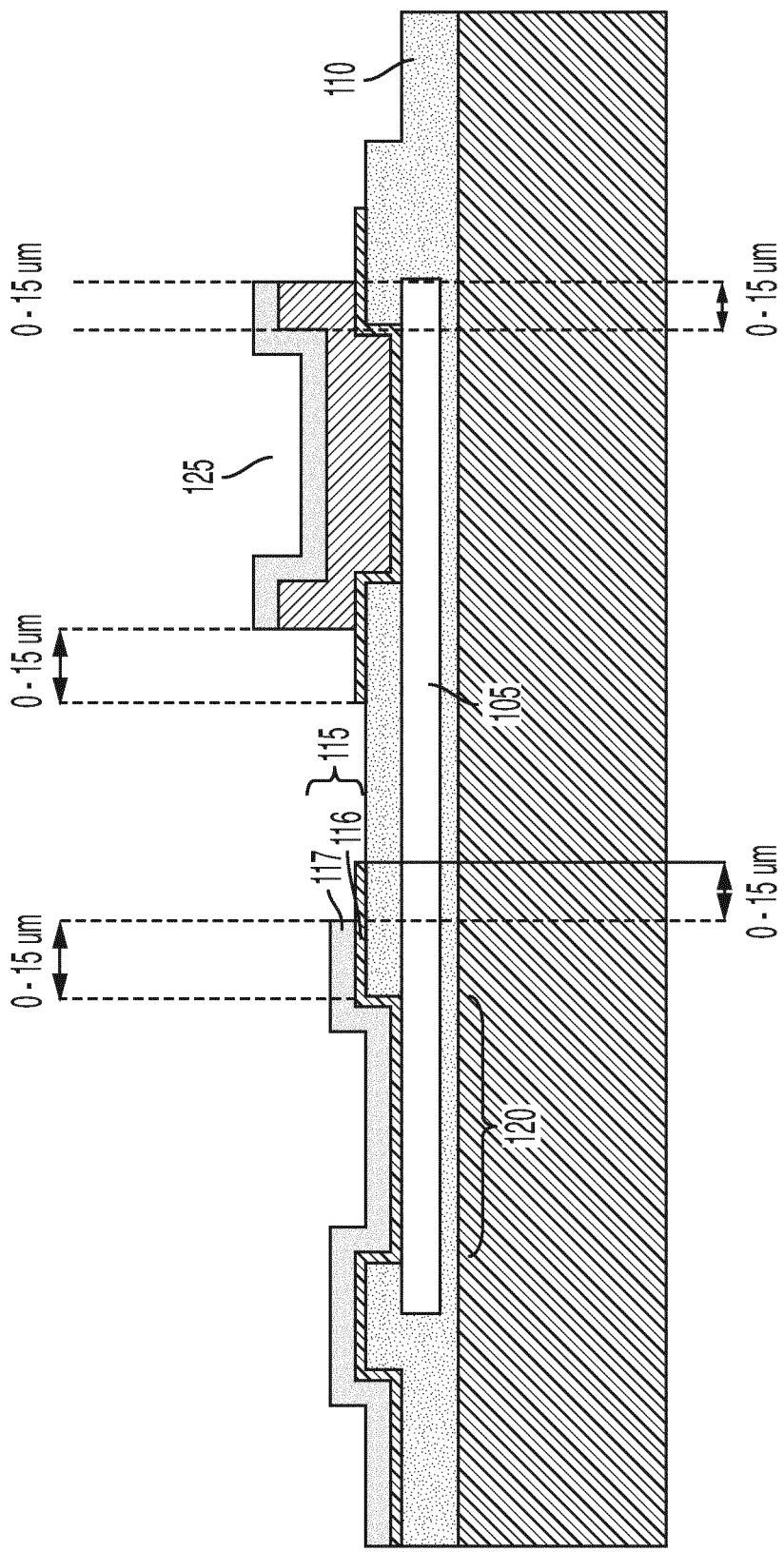
FIG. 9A is a side view of a portion of a photonic integrated circuit, according to an embodiment of the present disclosure.
Figure 9B:
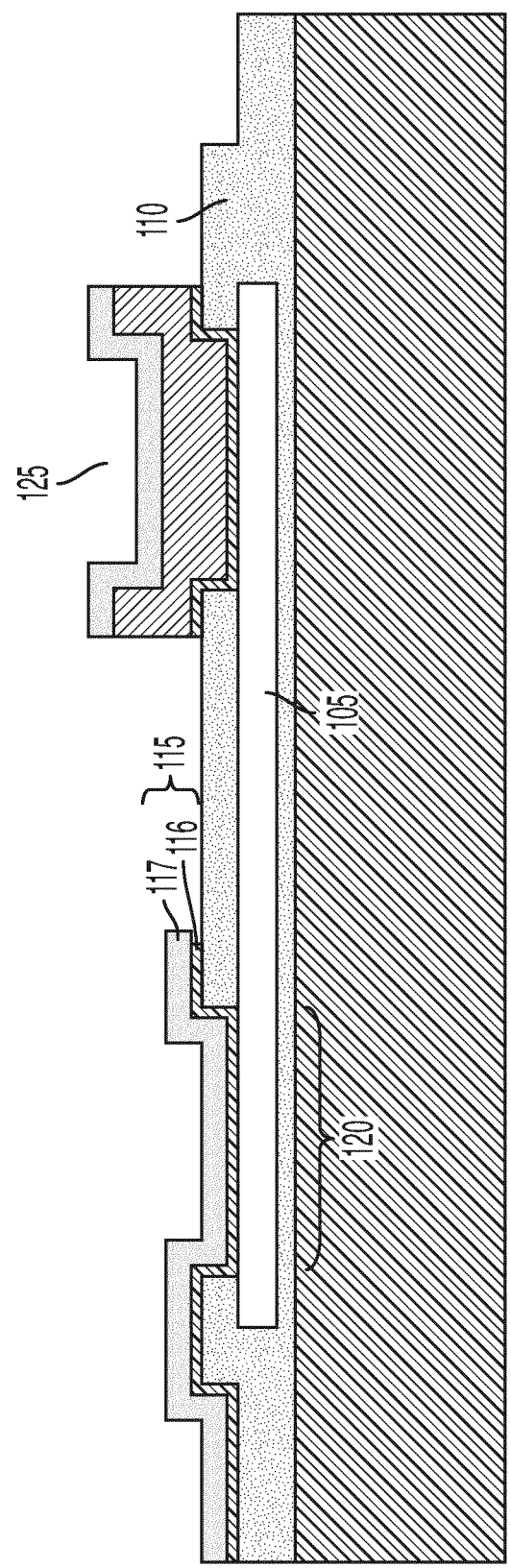
FIG. 9B is a side view of a portion of a photonic integrated circuit, according to an embodiment of the present disclosure.
Figure 10:
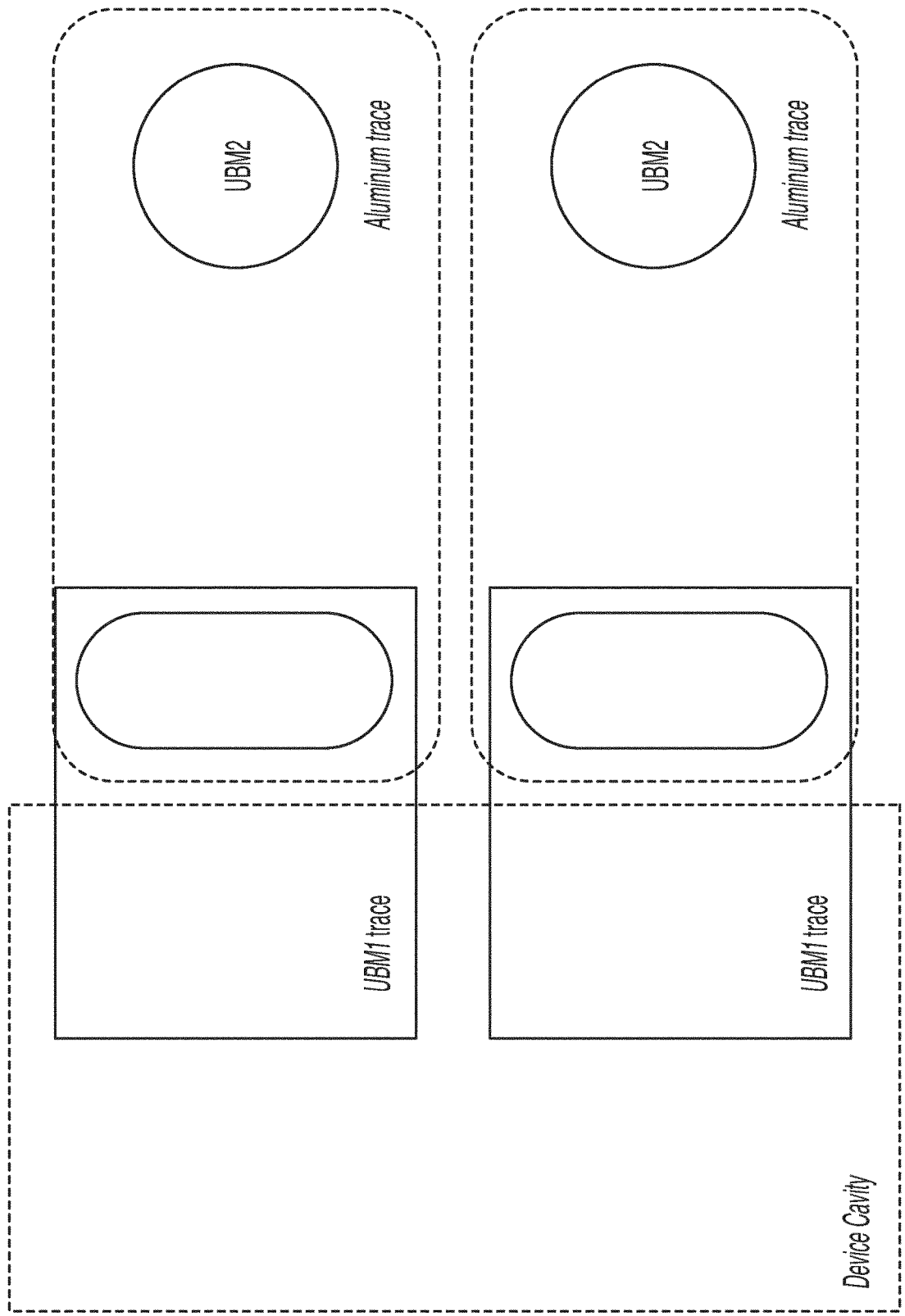
FIG. 10 is a top view of a portion of a photonic integrated circuit, according to an embodiment of the present disclosure.

Two different approaches may be used for the TiW etch (of FIGS. 7A and 7B). FIG. 9A shows the result of one of the methods, in which photoresist is used to offset the TiW pattern layer so that after the etch it extends beyond the pads. FIG. 9B shows the result of the other one of the methods, which involves using a blanket wet etch without a photoresist mask, relying on the BEOL structures (e.g., the structures formed prior to this etch) to mask and define the TiW seed layer during wet etch. FIG. 10 shows a top view of a high speed metal trace and pad design.

In some embodiments each connection from the fan out wafer level package may be made (instead of being made by a solder joint to a under bump metallization capture pad 125) by a wire bond to a wire bond pad on a second via 130. In such an embodiment, the structure of the pad may be modified accordingly from that of the under bump metallization capture pad 125 shown, e.g., on FIGS. 6A and 6B. The wire bond pad may be, for example, simply a layer of gold on a suitable barrier layer (e.g., TiW), or it may be a portion of the UBM1 layer.

Figure 11:
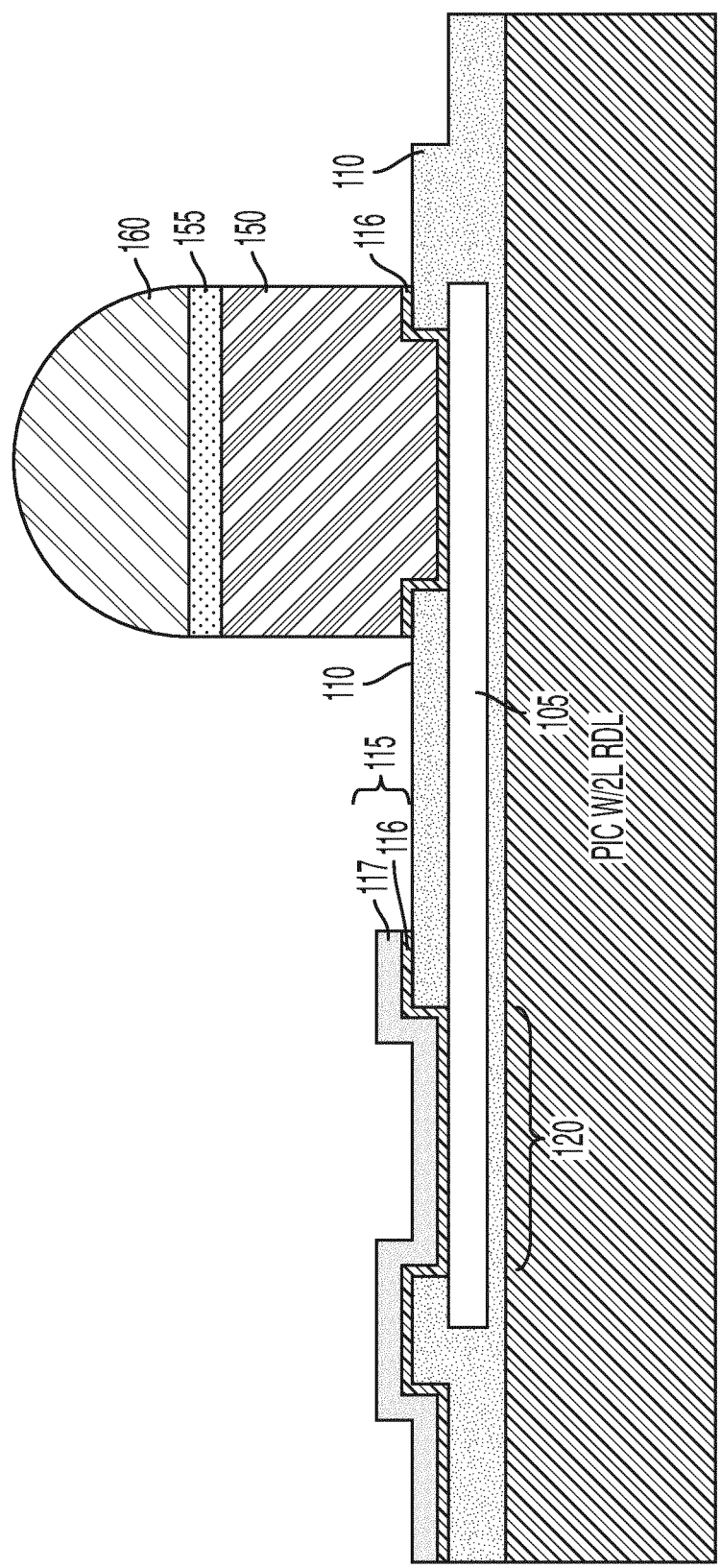
FIG. 11 is a side view of a portion of a photonic integrated circuit, according to an embodiment of the present disclosure.

FIG. 11 shows an embodiment similar to that of FIG. 1B, including, instead of the under bump metallization capture pad 125, a copper pillar bump including, e.g., a copper pillar 150, a layer of nickel 155 on the copper pillar 150, and a tin silver solder bump 160 on the layer of nickel 155. In some embodiments the first barrier layer 116 is present (as shown); in some embodiments it is absent.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s)

as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "primary component" refers to a component that is present in a composition, polymer, or product in an amount greater than an amount of any other single component in the composition or product. In contrast, the term "major component" refers to a component that makes up at least 50% by weight or more of the composition, polymer, or product. As used herein, the term "major portion", when applied to a plurality of items, means at least half of the items. As used herein, any structure or layer that is described as being "made of" or "composed of" a substance should be understood (i) in some embodiments, to contain that substance as the primary component or (ii) in some embodiments, to contain that substance as the major component. As used herein, an element "composed of" a material need not have a uniform composition; for example, a conductive trace including a layer of gold on a layer of titanium tungsten may be considered to be "composed of" a combination of gold, titanium, and tungsten.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

As used herein, the word "or" is inclusive, so that, for example, "A or B" means any one of (i) A, (ii) B, and (iii) A and B. As used herein, "a portion of" something means all, or less than all, of the thing. As such, for example "a portion of a layer" means all or less than all of the layer.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a silicon photonic interposer with two metal redistribution layers have been specifically described and illustrated herein, many modifications and variations will be apparent to those skilled in the art. Accordingly, it is to be understood that a silicon photonic interposer with two metal redistribution layers constructed according to principles of this disclosure may be embodied other than as specifically described herein. The invention is also defined in the following claims, and equivalents thereof.

What is claimed is:

1. A method for fabricating a silicon integrated circuit, the method comprising:
    fabricating a first intermediate product, comprising:
        a silicon substrate,
        a first conductive layer on the silicon substrate, and
        a dielectric layer on the first conductive layer;
    etching a first opening and a second opening, into the dielectric layer, onto the first conductive layer;
    forming a second conductive layer on the dielectric layer and on the first conductive layer in the first opening and in the second opening; and
    removing a portion of the second conductive layer in a region including the second opening and a region surrounding the second opening.

2. The method of claim 1, further comprising forming a wire bond pad on the first conductive layer in the second opening.

3. The method of claim 1, further comprising:
    forming an under bump metallization capture pad on:
        the first conductive layer in the second opening, and
        a region surrounding the second opening; and
    removing a remainder of the second conductive layer in a region around the under bump metallization capture pad.

4. The method of claim 3, wherein the under bump metallization capture pad comprises:
    a layer of nickel, and
    a layer of gold on the layer of nickel.

5. The method of claim 1, wherein the first conductive layer is composed of a material selected from the group consisting of aluminum, copper, gold, and alloys and combinations thereof.

6. The method of claim 1, wherein the second conductive layer comprises a layer of a material selected from the group consisting of gold, copper, aluminum, and alloys and combinations thereof.

7. The method of claim 6, wherein the second conductive layer further comprises a layer of material selected from the group consisting of titanium, tungsten, tantalum, and alloys and combinations thereof.

8. The method of claim 1, wherein the dielectric layer is composed of a material selected from the group consisting of silicon dioxide, silicon nitride, benzocyclobutene, polyimides, and combinations thereof.

9. A silicon integrated circuit fabricated using the method of claim 1, the silicon integrated circuit comprising:
   a first conductive trace, on a top surface of the silicon integrated circuit;
   the dielectric layer, wherein the dielectric layer is on the first conductive trace; and
   a second conductive trace, on the dielectric layer, connected to the first conductive trace through a first via.

10. The silicon integrated circuit of claim 9, further comprising an under bump metallization capture pad, on, and connected to the first conductive trace through, a second via.

11. The silicon integrated circuit of claim 10, wherein the under bump metallization capture pad comprises:
   a layer of nickel, and
   a layer of gold on the layer of nickel.

12. The silicon integrated circuit of claim 9, further comprising a wire bond pad, on, and connected to the first conductive trace through, a second via.

13. The silicon integrated circuit of claim 9, wherein the first conductive trace is composed of a material selected from the group consisting of gold, aluminum, copper, and alloys and combinations thereof.

14. The silicon integrated circuit of claim 9, wherein the second conductive trace is composed of a material selected from the group consisting of gold, aluminum, copper, titanium, tungsten, tantalum, and alloys and combinations thereof.

15. The silicon integrated circuit of claim 14, wherein the second conductive trace further comprises a layer of titanium tungsten.

16. The silicon integrated circuit of claim 9, wherein the dielectric layer is composed of a material selected from the group consisting of silicon dioxide, silicon nitride, benzocyclobutene, polyimides, and combinations thereof.

17. The silicon integrated circuit of claim 9, wherein the dielectric layer is composed of silicon nitride.

* * * * *